US012772797B2

(12) United States Patent
Hashimoto et al.

(10) Patent No.: US 12,772,797 B2
(45) Date of Patent: Oct. 20, 2026

(54) MEMBER FOR SEMICONDUCTOR MANUFACTURING APPARATUS, PLUG, AND METHOD OF MANUFACTURING PLUG

(71) Applicant: NGK INSULATORS, LTD., Nagoya-City (JP)

(72) Inventors: Hideaki Hashimoto, Nisshin (JP); Masashi Ono, Nagoya (JP); Michihiro Ashida, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 403 days.

(21) Appl. No.: 18/526,061

(22) Filed: Dec. 1, 2023

(65) Prior Publication Data

US 2024/0213082 A1 Jun. 27, 2024

(30) Foreign Application Priority Data

Dec. 21, 2022 (JP) ................................. 2022-203898

(51) Int. Cl.
*H01L 21/687* (2006.01)
*H01J 37/32* (2006.01)
*H10P 72/76* (2026.01)

(52) U.S. Cl.
CPC .... *H10P 72/7624* (2026.01); *H01J 37/32715* (2013.01); *H10P 72/7616* (2026.01); *H01J 2237/20235* (2013.01)

(58) Field of Classification Search
CPC .............. H10P 72/7624; H10P 72/7616; H01J 2237/20235
See application file for complete search history.

(56) References Cited

U.S. PATENT DOCUMENTS

2019/0035667 A1 1/2019 Minemura
2020/0286769 A1* 9/2020 Shiraishi ............. H01J 37/3244
2020/0294838 A1* 9/2020 Yoshikawa ....... H01J 37/32724
(Continued)

FOREIGN PATENT DOCUMENTS

CN 114864435 A 8/2022
JP 2019-029384 A 2/2019
(Continued)

OTHER PUBLICATIONS

Korean Office Action (Application No. 10-2023-0173004) dated Dec. 2, 2024 (with English translation) (17 pages).
(Continued)

*Primary Examiner* — Joseph A Miller, Jr.
(74) *Attorney, Agent, or Firm* — Muncy, Geissler, Olds & Lowe, P.C.

(57) ABSTRACT

A member for semiconductor manufacturing apparatus includes a ceramic plate that has an upper surface that includes a wafer placement portion, and a plug that is installed in a plug installation hole extending through the ceramic plate in an up-down direction and that allows gas to pass therethrough, wherein the plug has a gas flow path that includes a plurality of linear flow paths that is combined such that the plurality of linear flow paths intersects with each other in a plug body, and wherein the gas flow path includes a plurality of opening portions in an upper surface and a lower surface of the plug body.

5 Claims, 9 Drawing Sheets

(56) References Cited

U.S. PATENT DOCUMENTS

| | | | |
|---|---|---|---|
| 2022/0032501 A1 | 2/2022 | Aoki et al. | |
| 2022/0246398 A1 | 8/2022 | Ishikawa et al. | |

FOREIGN PATENT DOCUMENTS

| | | | |
|---|---|---|---|
| JP | 7144603 B2 | | 9/2022 |
| KR | 10-2020-0109253 A | | 9/2020 |
| KR | 10-2022-0112664 A | | 8/2022 |
| WO | WO2022020639 | * | 1/2022 |

OTHER PUBLICATIONS

Taiwanese Office Action dated Oct. 8, 2024 (Application No. 112149210).

* cited by examiner

MEMBER FOR SEMICONDUCTOR MANUFACTURING APPARATUS, PLUG, AND METHOD OF MANUFACTURING PLUG

BACKGROUND OF THE INVENTION

1. Field of the Invention

The present invention relates to a member for semiconductor manufacturing apparatus, a plug, and a method of manufacturing a plug.

2. Description of the Related Art

An existing member for semiconductor manufacturing apparatus includes an electrostatic chuck that has an upper surface that includes a wafer placement portion. For example, an electrostatic chuck disclosed in PTL 1 includes a ceramic plate that attracts and holds a wafer, a through-hole that is formed in the ceramic plate, a porous plug that is disposed in the through-hole, and a conductive cooling plate that is stuck to a lower surface of the ceramic plate. In the case where the wafer that is placed on the wafer placement portion is processed by using plasma, high-frequency power is applied between the cooling plate and a flat plate electrode that is disposed at an upper portion of the wafer, and the plasma is generated at the upper portion of the wafer. In addition, helium that is a heat conduction gas is supplied to a back surface of the wafer via the porous plug in order to improve heat conduction between the wafer and the ceramic plate. The heat conduction gas passes through a large number of pores in the porous plug. For this reason, as for the porous plug, the larger number of pores function as gas flow paths. PTL 2 discloses a member for semiconductor manufacturing apparatus that uses a plug that has a spiral gas flow path in a dense plug body.

CITATION LIST

Patent Literature

PTL 1: Japanese Unexamined Patent Application Publication No. JP 2019-29384 A
PTL 2: Japanese Patent No. JP 7144603 B

SUMMARY OF THE INVENTION

In PTL 1, however, the large number of pores (that is, gaps between particles) in the porous plug are used as the gas flow paths, and accordingly, it is difficult to manufacture the gas flow paths in accordance with design. For this reason, there is a problem in that the gas flow paths differ between porous plugs, and quality is unlikely to be stable. In PTL 2, the single spiral gas flow path is used, and accordingly, the gas flow path can be manufactured in accordance with design, but a decrease in thickness of the gas flow path results in an insufficient gas flow rate in some cases. An increase in thickness of the gas flow path results in a sufficient gas flow rate but causes arc discharge to occur in the gas flow path when plasma is generated, and the quality of the wafer decreases in some cases.

The present invention has been accomplished to solve the problems, and it is a main object of the present invention to enables a gas flow path to be manufactured in accordance with design and to ensure a sufficient gas flow rate while arc discharge is inhibited from occurring in the gas flow path.

[1] A member for semiconductor manufacturing apparatus according to the present invention includes a ceramic plate that has an upper surface that includes a wafer placement portion, and a plug that is installed in a plug installation hole extending through the ceramic plate in an up-down direction and that allows gas to pass therethrough. The plug has a gas flow path that includes a plurality of linear flow paths that is combined such that the plurality of linear flow paths intersects with each other in a plug body. The gas flow path includes a plurality of opening portions in an upper surface and a lower surface of the plug body.

As for the member for semiconductor manufacturing apparatus, the plug has the gas flow path that includes the plurality of linear flow paths that is combined such that the plurality of linear flow paths intersects with each other in the plug body, and the gas flow path includes the plurality of opening portions in the upper surface and the lower surface of the plug body. Here, the gas flow path includes the plurality of linear flow paths that is combined such that the plurality of linear flow paths intersects with each other instead of pores. For this reason, the gas flow path can be manufactured in accordance with design. A decrease in thickness of the plurality of linear flow paths enables arc discharge to be inhibited from occurring in the gas flow path. An increase in the number of the plurality of linear flow paths or the number of the plurality of opening portions enables a sufficient gas flow rate to be ensured even when the plurality of linear flow paths is thin.

In the present specification, the words "up-down", "left-right", and "front-rear" are used to describe the present invention in some cases, but the words "up-down", "left-right", and "front-rear" merely represent relative positional relationships. For this reason, the word "up-down" is changed into the word "left-right" or the word "left-right" is changed into the word "up-down" in some cases where the direction of the member for semiconductor manufacturing apparatus is changed. These cases are also included in the technical scope of the present invention.

[2] As for the above member for semiconductor manufacturing apparatus (the member for semiconductor manufacturing apparatus described in [1] described above), a maximum length of the gas flow path in the up-down direction may be 0.5 mm or less. This enables arc discharge to be sufficiently inhibited from occurring in the gas flow path.

[3] As for the above member for semiconductor manufacturing apparatus (the member for semiconductor manufacturing apparatus described in [1] or [2] described above), the gas flow path may include the plurality of linear flow paths that linearly extends in the up-down direction, a left-right direction, and a front-rear direction and that is combined such that the plurality of linear flow paths is perpendicular to each other. This enables the gas flow path to be relatively easily designed.

[4] As for the above member for semiconductor manufacturing apparatus (the member for semiconductor manufacturing apparatus described in [1] or [2] described above), the gas flow path may include the plurality of linear flow paths that linearly extends in an oblique direction and that is combined such that the plurality of linear flow paths intersects with each other or may include the plurality of linear flow paths that linearly extends in an oblique direction and in a horizontal direction and that is combined such that the plurality of linear flow paths intersects with each other. This enables the gas flow path to be relatively easily designed.

[5] As for the above member for semiconductor manufacturing apparatus (the member for semiconductor manufacturing apparatus described in any one of [1] to [4] described above), the plug body may be composed of dense ceramics, and the gas flow path may include no opening portion in a side surface of the plug body. In this case, when an outer circumferential surface of the plug and an inner circumferential surface of the plug installation hole are stuck to each other by using an adhesive, the adhesive does not permeate the plug. For this reason, a gap can be prevented from being formed in an adhesive layer that is used to stick the outer circumferential surface of the plug and the inner circumferential surface of the plug installation hole to each other.

[6] A plug according to the present invention includes a plug body, a gas flow path that includes a plurality of linear flow paths that is combined such that the plurality of linear flow paths intersects with each other in the plug body, and a plurality of opening portions that is included in the gas flow path and that opens from an upper surface and a lower surface of the plug body.

The plug can be used as a plug for the member for semiconductor manufacturing apparatus described above.

[7] A method of manufacturing a plug according to the present invention is a method of manufacturing the above plug (the plug described in [6] described above), and the method includes (a) a step of manufacturing a mold by using an organic material, the mold having a molding space that has the same shape as a molded body that is a precursor of the plug, the mold being formed into a one-piece together with a core that corresponds to the gas flow path, (b) a step of manufacturing the molded body in the mold by injecting and solidifying a ceramic slurry in the molding space of the mold, (c) a step of obtaining the molded body by removing the mold from a one-piece of the mold and the molded body, and (d) a step of obtaining the plug by firing the molded body.

In this case, the plug that has the gas flow path that includes the plurality of linear flow paths that is combined such that the plurality of linear flow paths intersects with each other in the plug body can be easily manufactured with precision.

At the step (a), the mold may be manufactured by using a 3D printer, the 3D printer may use, as a model material, a material that is insoluble in a predetermined cleaning solution and a component that is contained in the ceramic slurry after solidification and may use, as a support material, a material that is soluble in the predetermined cleaning solution after solidification. The meaning of "being insoluble" in the present specification includes being completely insoluble and being soluble to an extent that a desired shape can be maintained. This enables the mold that is formed into the one-piece together with the core to be relatively easily manufactured and eliminates a concern that the mold dissolves to an extent that the shape thereof cannot be maintained due to the component that is contained in the ceramic slurry.

At the step (b), a slurry that contains ceramic powder and a gelling agent may be used as the ceramic slurry, the gelling agent may be chemically reacted after the ceramic slurry is injected into the mold, the ceramic slurry may be caused to gel, and the molded body may be consequently manufactured in the mold. In this case, the ceramic slurry is filled in the molding space of the mold that is formed into the one-piece together with the core without space, and consequently, the molded body matches the shape of the molding space with precision.

A method of removing the mold at the step (c) is not particularly limited. For example, the mold may be removed by being melted and removed, or the mold may be removed by chemical decomposition (including, for example, thermal decomposition).

DETAILED DESCRIPTION OF THE INVENTION

Figure 1:
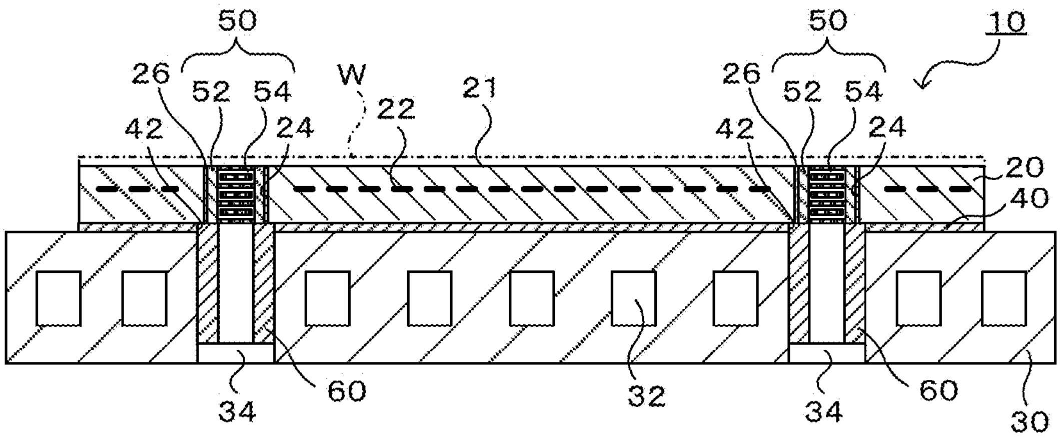
FIG. 1 illustrates a vertical cross-section of a member 10 for semiconductor manufacturing apparatus.
Figure 2:
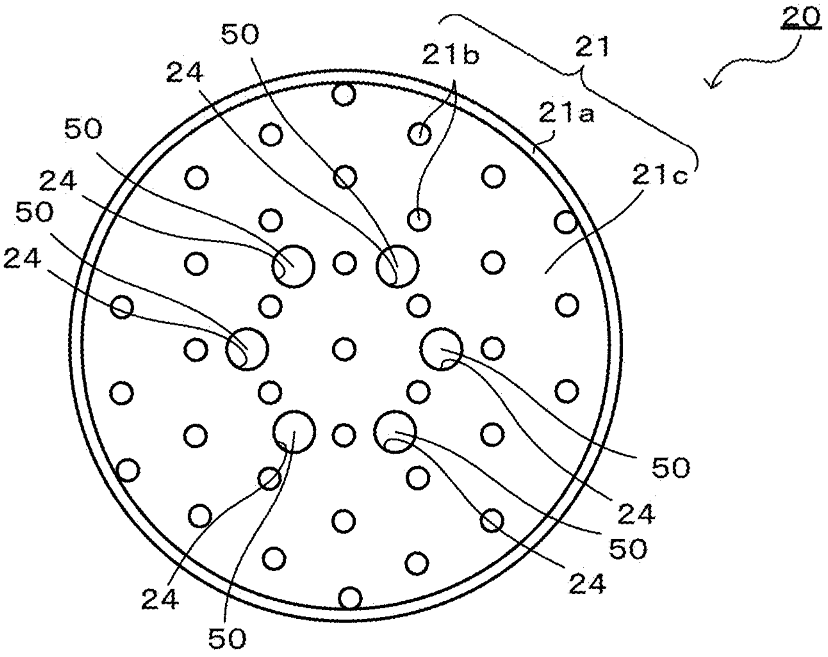
FIG. 2 is a plan view of a ceramic plate 20.
Figure 3:
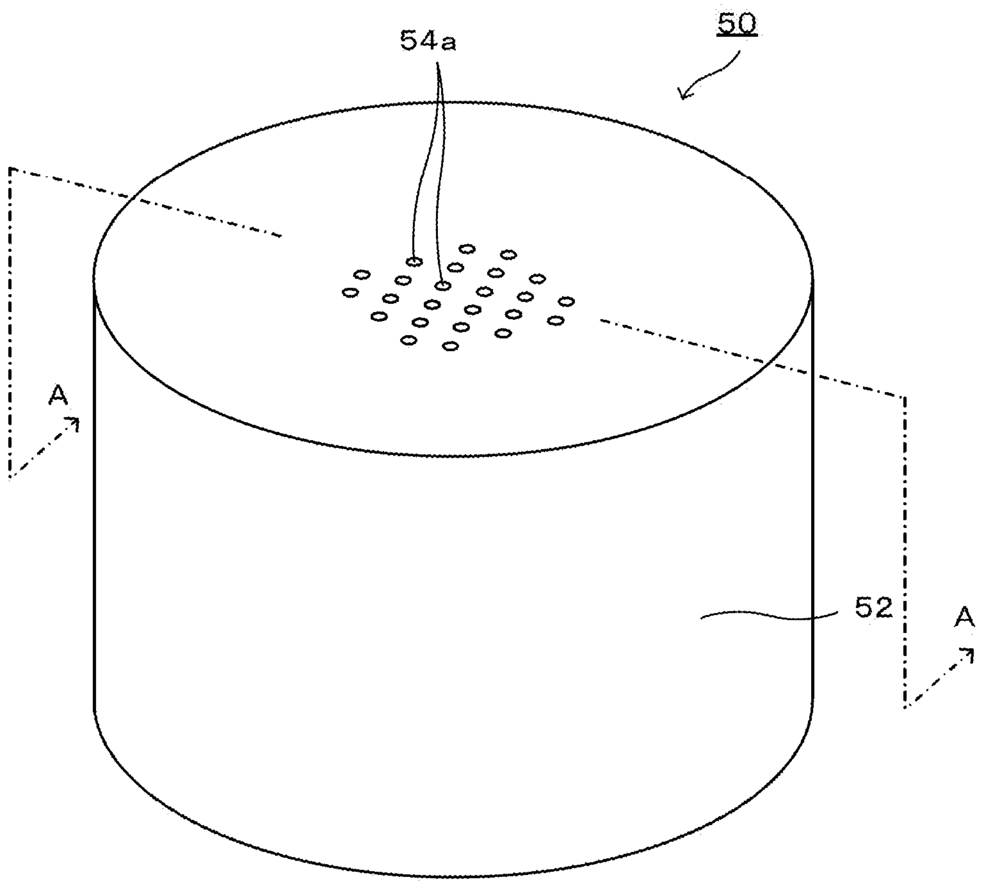
FIG. 3 is a perspective view of a plug 50.
Figure 4:
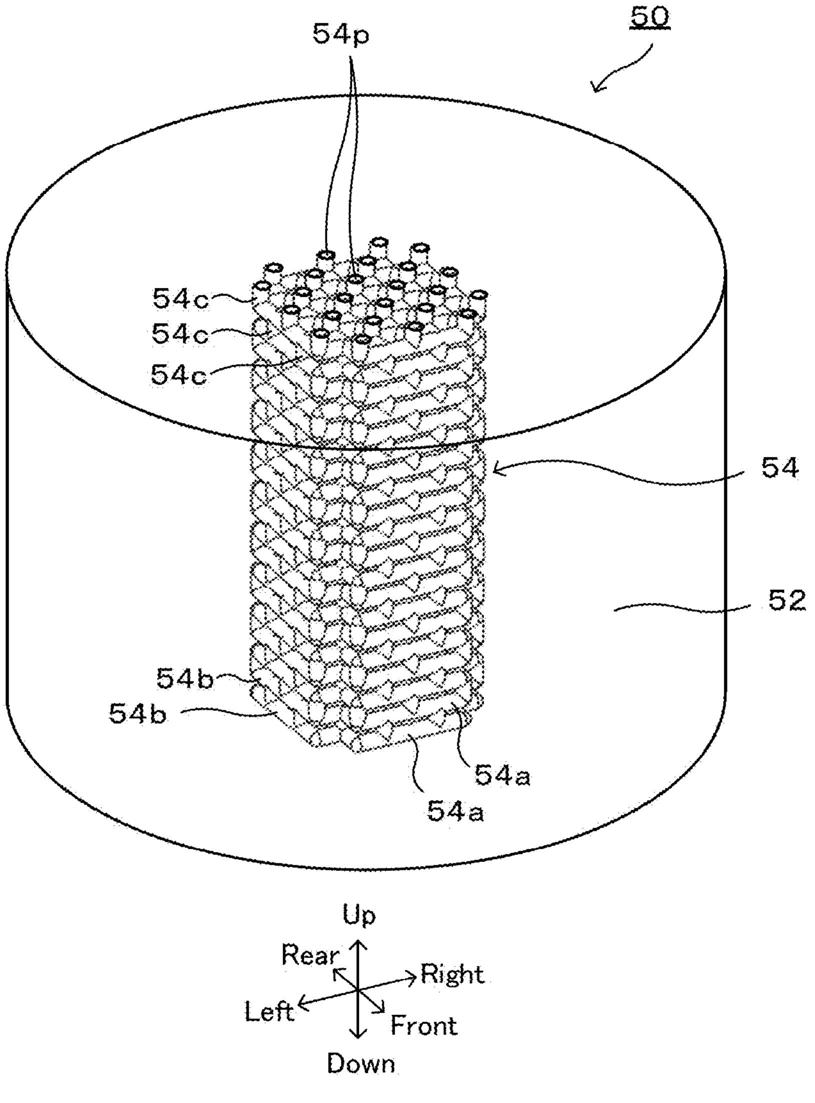
FIG. 4 is a reference perspective view of the plug 50.
Figure 5:
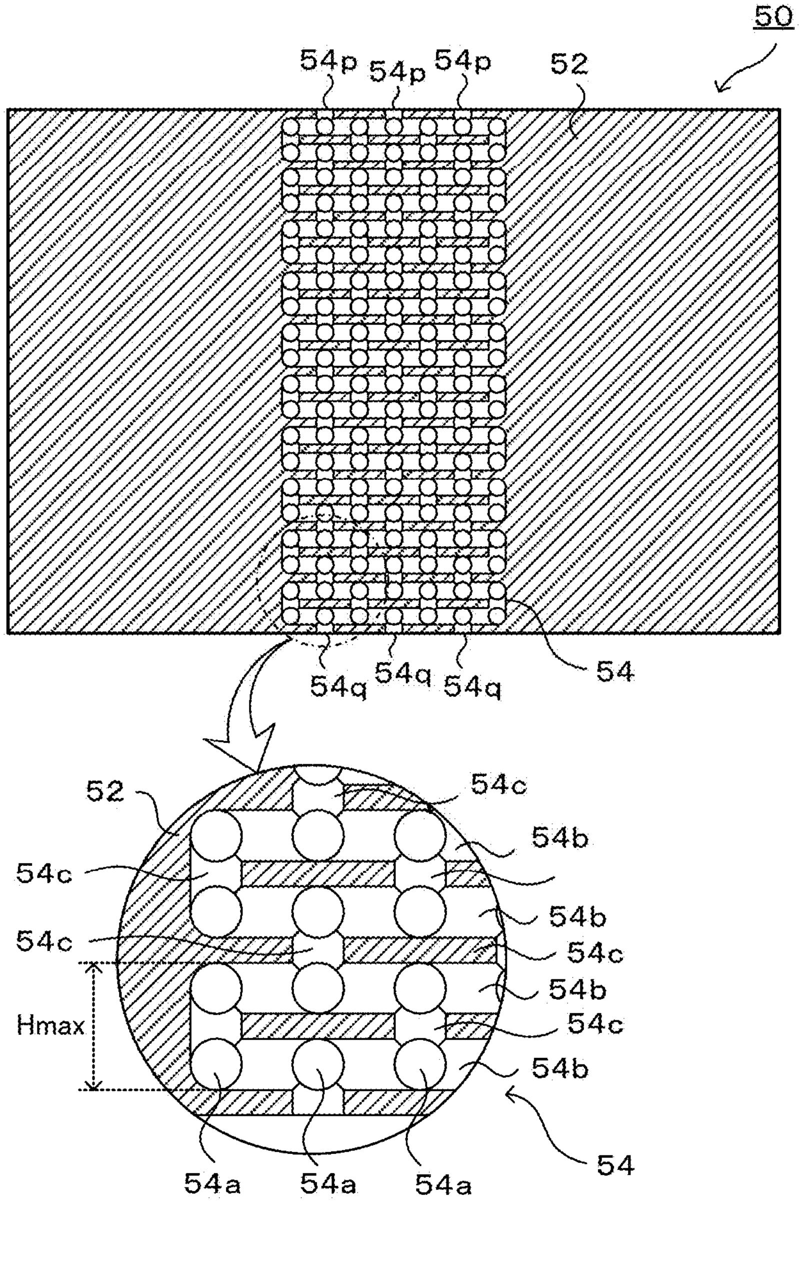
FIG. 5 is a sectional view taken along line A-A in FIG. 3.

A preferred embodiment of the present invention will now be described with reference to the drawings. FIG. 1 illustrates a vertical cross-section of a member 10 for semiconductor manufacturing apparatus. FIG. 2 is a plan view of a ceramic plate 20. FIG. 3 is a perspective view of a plug 50. FIG. 4 is a reference perspective view (a perspective view in which a gas flow path 54 that is to be originally represented by using a hidden line (a dashed line) is presented by using a solid line for convenience) of the plug 50. FIG. 5 is a sectional view taken along line A-A in FIG. 3.

The member 10 for semiconductor manufacturing apparatus includes the ceramic plate 20, a cooling plate 30, a joining layer 40, the plugs 50, and an insulating pipe 60.

The ceramic plate 20 is a ceramic disk plate (for example, a diameter of 300 mm, and a thickness of 5 mm) such as an alumina sintered body or an aluminum nitride sintered body. The ceramic plate 20 contains an electrode 22. At a wafer placement portion 21 of the ceramic plate 20, as illustrated in FIG. 2, a seal band 21*a* is formed along an outer edge, and multiple circular small projections 21*b* are formed over the entire surface. The seal band 21*a* and the circular small projections 21*b* have the same height, and the height thereof is, for example, several μm to several 10 μm. The electrode 22 is a planar mesh electrode that is used as an electrostatic electrode, and a direct voltage can be applied thereto. When the direct voltage is applied to the electrode 22, a wafer W is attracted and secured to the wafer placement portion 21 (specifically, an upper surface of the seal band 21*a* and upper surfaces of the circular small projections 21*b*) by using electrostatic attraction force. When applying the direct voltage ends, the wafer W that is attracted and secured to the wafer placement portion 21 is released. A portion of the wafer placement portion 21 on which the seal band 21*a* and the circular small projections 21*b* are not provided is referred to as a reference surface 21*c*.

Plug installation holes 24 are cylindrical through-holes that extend through the ceramic plate 20 in an up-down direction. The plug installation holes 24 are provided at multiple positions (for example, multiple positions equally spaced from each other in a circumferential direction as illustrated in FIG. 2) in the ceramic plate 20. The plugs 50 described later are installed in the plug installation holes 24.

The cooling plate 30 is joined to a lower surface of the ceramic plate 20. The cooling plate 30 is a disk plate (a disk plate that has a diameter equal to or larger than the diameter of the ceramic plate 20) that has good thermal conductivity. The cooling plate 30 contains a refrigerant flow path 32 through which refrigerant circulates and gas holes 34 in which gas is supplied to the porous plugs 50. The refrigerant is preferably a liquid and preferably has electrical insulation properties. An example of a liquid that has the electrical insulation properties is a fluorine inert liquid. The refrigerant flow path 32 is formed in a one-stroke pattern from an inlet to an outlet over the entire cooling plate 30 in a plan view. The gas holes 34 have a cylindrical shape and face the plug installation holes 24. Examples of the material of the cooling plate 30 include a metal material and a composite material of metal and ceramics. Examples of the metal material include Al, Ti, Mo, or an alloy thereof. Examples of the composite material of metal and ceramics include a metal matrix composite material (MMC) and a ceramic matrix composite material (CMC). Specific examples of the composite material include a material that contains Si, SiC, and Ti, a material obtained by impregnating a SiC porous body with Al and/or Si, and a composite material of $Al_2O_3$ and TiC. The material that contains Si, SiC, and Ti is referred to as SiSiCTi. The material that is obtained by impregnating the SiC porous body with Al is referred to as AlSiC. The material that is obtained by impregnating the SiC porous body with Si is referred to as SiSiC. The material of the cooling plate 30 is preferably a material that has a coefficient of thermal expansion close to that of the material of the ceramic plate 20. The cooling plate 30 is also used as a RF electrode. Specifically, an upper electrode (not illustrated) is disposed above the wafer placement portion 21, and plasma is generated when high-frequency power is applied between parallel flat plate electrodes that include the upper electrode and the cooling plate 30.

The Joining layer 40 joins the lower surface of the ceramic plate 20 and an upper surface of the cooling plate 30 to each other. The joining layer 40 may be composed of, for example, solder or a brazing metal material. The joining layer 40 is formed by, for example, TCB (Thermal compression bonding). The TCB is a known method of compressing and joining two members in a state in which the two members to be joined interpose a metal joining material therebetween and are heated to a temperature equal to or less than the solidus temperature of the metal joining material. The joining layer 40 may be an organic adhesive layer (a resin adhesive layer). For example, the organic resin layer is formed by solidifying an organic adhesive. The joining layer 40 has round holes 42 that extend through the joining layer 40 in the up-down direction at positions at which the round holes 42 face the gas holes 34.

Each plug 50 includes a plug body 52 composed of dense ceramics and the gas flow path 54 that is provided in the plug body 52. The plugs 50 are installed in plug installation holes 24. Outer circumferential surfaces of the plugs 50 are stuck to inner circumferential surfaces of the plug installation holes 24 by using adhesive layers 26. The adhesive layers 26 may be organic adhesive layers (resin adhesive layers) or inorganic adhesive layers. For example, the plug body 52 may be composed of the same ceramic material as that of the ceramic plate 20. The gas flow path 54 allows gas to pass therethrough and includes multiple linear flow paths 54*a*, 54*b*, and 54*c* that are combined such that the multiple linear flow paths 54*a*, 54*b*, and 54*c* intersect with each other in the plug body 52. The gas flow path 54 includes multiple opening portions 54*p* and 54*q* in an upper surface and a lower surface of the plug body 52 but includes no opening portions in an outer circumferential surface (a side surface) of the plug body 52. The maximum length Hmax (see an enlarged view of a portion in FIG. 5) of the gas flow path 54 in an up-down direction is preferably 0.5 mm or less.

According to the present embodiment, the gas flow path 54 includes the multiple linear flow paths 54*a*, 54*b*, and 54*c* that linearly extend in a left-right direction, a front-rear direction, and the up-down direction and that are combined such that the multiple linear flow paths 54*a*, 54*b*, and 54*c* are perpendicular to each other and form a lattice. Specifically, the multiple linear flow paths 54*a* that linearly extend in the left-right direction are equally spaced from each other in the front-rear direction, and the multiple linear flow paths 54*b* that linearly extend in the front-rear direction are equally spaced from each other in the left-right direction so as to be perpendicular to the linear flow paths 54*a*. Intersection points between the linear flow paths 54*a* and the linear flow paths 54*b* are branch paths for gas. Such multiple horizontal planes are equally spaced from each other in the up-down direction. Gaps between the linear flow paths 54*a* and 54*b* are not limited to being constant but may be, for example, random gaps. Upper linear flow paths 54*a* and 54*b* and lower linear flow paths 54*a* and 54*b* on two horizontal planes adjacent to each other in the up-down direction are connected to each other by multiple linear flow paths 54*c* that linearly extend in the up-down direction. Such connection portions correspond to branch paths for gas. The multiple linear flow paths 54*c* that extend in the up-down direction are not aligned in a line in the up-down direction but are provided in a staggered arrangement when the entire plug 50 is viewed.

The insulating pipes 60 are circular pipes composed of dense ceramics in a plan view. Outer circumferential surfaces of the insulating pipes 60 are stuck to inner circumferential surfaces of the round holes 42 of the joining layer 40 and inner circumferential surfaces of the gas holes 34 of the cooling plate 30 by using adhesive layers not illustrated. The adhesive layers may be organic adhesive layers (resin adhesive layers) or inorganic adhesive layers. The adhesive layers may be provided between an upper surface of the insulating pipes 60 and the lower surface of the ceramic plate 20. Inner portion of the insulating pipes 60 are in communication with the plugs 50. For this reason, gas that is introduced into the insulating pipes 60 passes through the plugs 50 and is supplied to a back surface of the wafer W.

An example of the use of the member 10 for semiconductor manufacturing apparatus thus configured will now be described. The wafer W is first placed on the wafer placement portion 21 with the member 10 for semiconductor manufacturing apparatus installed in a chamber not illustrated. The pressure of the chamber is decompressed by a vacuum pump and is adjusted such that a predetermined degree of vacuum is achieved. A direct voltage is applied to the electrode 22 of the ceramic plate 20 to generate electrostatic attraction force, and the wafer W is attracted and secured to the wafer placement portion 21 (specifically, the upper surface of the seal band 21*a* and the upper surfaces of the circular small projections 21*b*). Subsequently, a reactive gas atmosphere at a predetermined pressure (for example, several tens of Pa to several hundreds of Pa) is created in the chamber. In this state, a high-frequency voltage is applied between an upper electrode, not illustrated, on a ceiling portion in the chamber and the cooling plate 30 of the member 10 for semiconductor manufacturing apparatus, and plasma is generated. The surface of the wafer W is processed by the generated plasma. The refrigerant circulates through the refrigerant flow path 32 of the cooling plate 30. Backside gas is introduced into the gas holes 34 from a gas tank not illustrated. Heat conduction gas (such as helium) is used as the backside gas. The backside gas passes through the insulating pipes 60 and the plugs 50, is supplied to a space between the back surface of the wafer W and the reference surface 21*c* of the wafer placement portion 21, and is sealed. The backside gas enables heat conduction between the wafer W and the ceramic plate 20 to be efficient.

Figure 6:
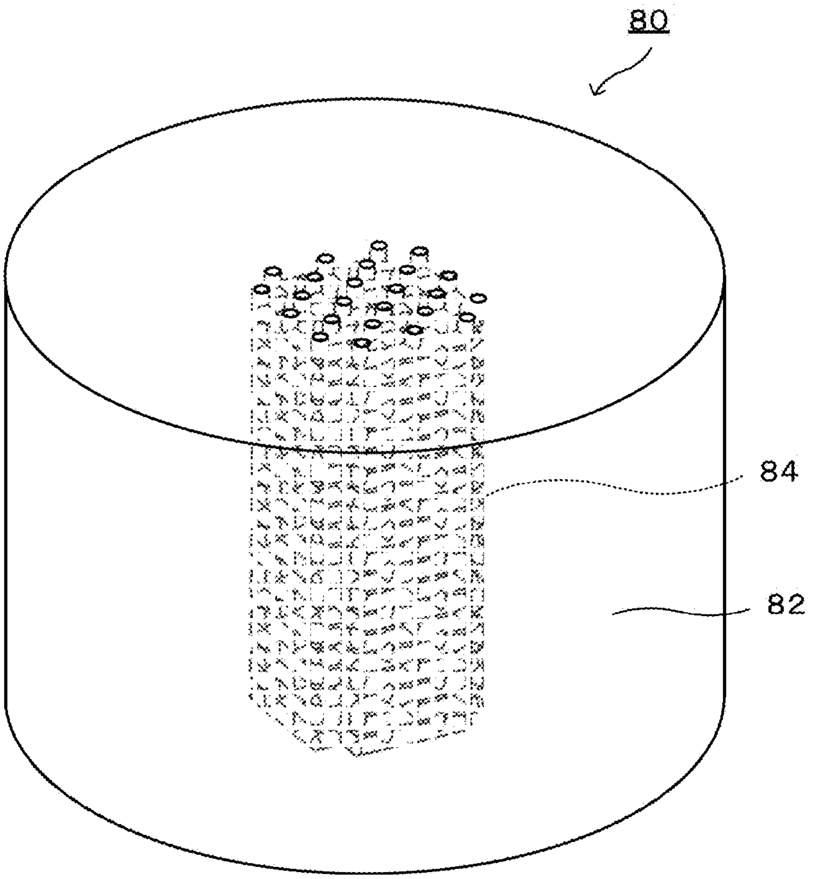
FIG. 6 is a perspective view of a molded body 80.

An example of manufacturing each plug 50 will now be described. The plug 50 is manufactured by following steps (a) to (d) in this order. A molded body 80 illustrated in FIG. 6 that is fired corresponds to the plug 50. The dimensions of the molded body 80 are determined based on the dimensions of the plug 50 in consideration for tightening during firing. The molded body 80 includes a hollow portion 84 that is to be the gas flow path 54 after firing in a molded body base 82. The hollow portion 84 opens from an upper surface and a lower surface of the molded body base 82.

Step (a)

Figure 7:
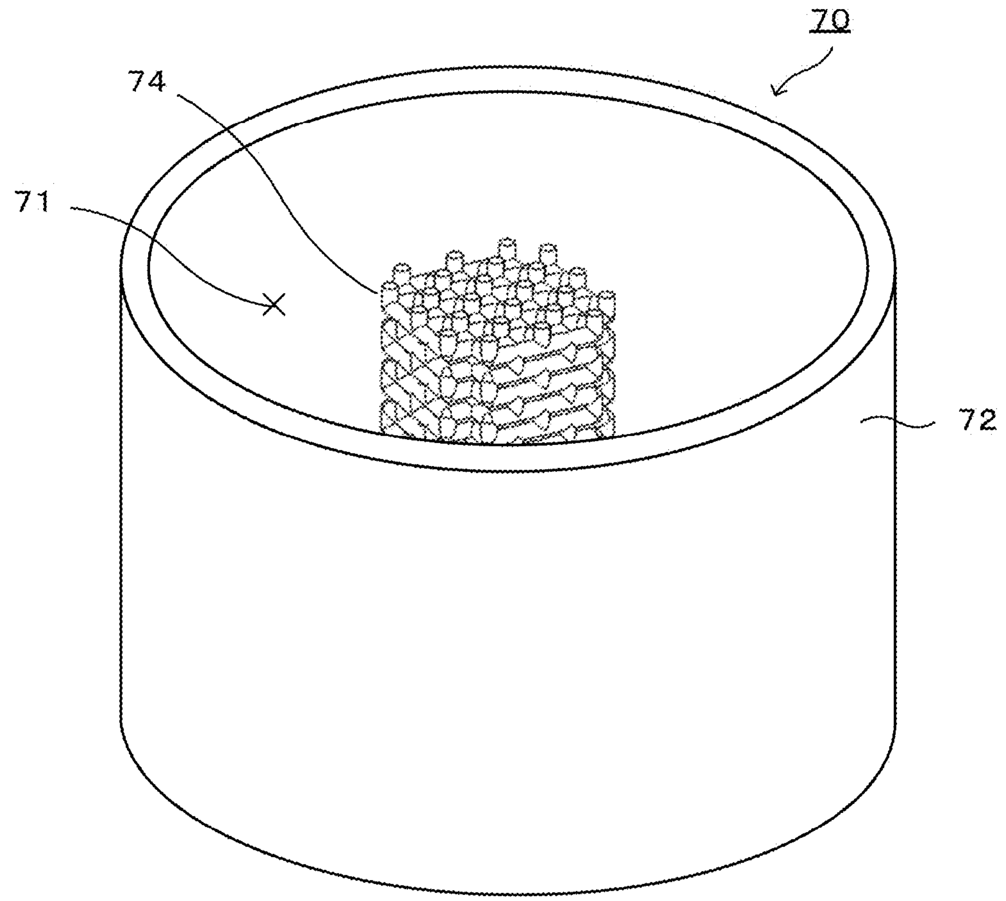
FIG. 7 is a perspective view of a mold 70.

At the step (a), a mold 70 is manufactured. As illustrated in FIG. 7, the mold 70 includes a mold body 72 that has a bottomed cylindrical shape and a core 74 that corresponds to the hollow portion 84 of the molded body 80. The mold 70 has a molding space 71 that has the same shape as the molded body 80. The molding space 71 is a space obtained by removing the core 74 from a cylindrical space inside the mold body 72. A lower end of the core 74 is formed into a one-piece together with a bottom surface of the mold body 72. An upper end of the core 74 is a free end. The mold 70 is manufactured by using a known 3D printer. The 3D printer repeats a series of operations of forming an unsolidified layer object by discharging an unsolidified fluid from a head portion onto a stage and solidifying the unsolidified layer object and consequently forms a structure. The 3D printer includes, as the unsolidified fluid, a model material of which a finally necessary portion of the mold 70 is composed and a support material of which a finally removed portion of the mold 70 that is a base that supports the model material is composed. Here, a material (for example, wax such as paraffin wax) that is insoluble in a predetermined cleaning solution (such as water, an organic solvent, acid, or an alkaline solution) and a component that is contained in a ceramic slurry described later after solidification is used as the model material. A material (for example, hydroxylation wax) that is soluble in the predetermined cleaning solution after solidification is used as the support material. An example of the predetermined cleaning solution is isopropyl alcohol. The 3D printer forms the structure by using slice data of layers sliced in a horizontal direction at a regular interval upward from below the mold 70. The slice data is obtained by processing CAD data. The slice data includes slice data in which the model material and the support material are present and slice data in which only the model material is present. The structure that is formed by the 3D printer is immersed into isopropyl alcohol such that the solidified support material is dissolved and removed, and consequently, an object composed of the solidified model material, that is, the mold 70 is obtained.

Step (b)

At the step (b), the molded body 80 is manufactured in the mold 70. Here, the molded body 80 is manufactured by mold casting. In the mold casting, a ceramic slurry that contains ceramic powder, a solvent, dispersant, and a gelling agent is injected into the molding space 71 of the mold 70, the gelling agent is chemically reacted, the ceramic slurry is caused to gel, and the molded body 80 is consequently manufactured in the mold 70. The mold casting can be performed in accordance with the content described in PTL 2.

Step (c)

At the step (c), the mold 70 is removed from a one-piece into which the mold 70 and the molded body 80 are formed, and the molded body 80 is obtained. In the case where the material of the mold 70 has a melting point (the upper limit of the temperature in the case where the melting point is represented by using a temperature range) equal to or less than the drying temperature of the molded body 80, the mold 70 can be melted and removed at the drying temperature when the molded body 80 is dried. For example, in the case where the material of the mold 70 is wax that is melted at 70° C., the mold 70 is melted and removed when the molded body 80 is dried at 80° C., and the molded body 80 can be obtained.

Step (d)

At the step (d), the molded body 80 is degreased and is subsequently fired, and the plug 50 is manufactured. A degreasing temperature and a firing temperature (the maximum temperature) may be appropriately determined in consideration for the temperature at which ceramic powder that is contained in the molded body 80 is sintered. A degreasing atmosphere and a firing atmosphere may be appropriately selected from the atmosphere, an inert gas atmosphere, a vacuum atmosphere, and a hydrogen atmosphere.

As for the member 10 for semiconductor manufacturing apparatus described in detail above, each plug 50 has the gas flow path 54 that includes the multiple linear flow paths 54*a*, 54*b*, and 54*c* that are combined such that the multiple linear flow paths 54*a*, 54*b*, and 54*c* intersect with each other in the plug body 52, and the gas flow path 54 includes the multiple opening portions 54*p* and 54*q* in the upper surface and the lower surface of the plug 50. The gas flow path 54 includes the multiple linear flow paths 54*a*, 54*b*, and 54*c* that are combined such that the multiple linear flow paths 54*a*, 54*b*, and 54*c* intersect with each other instead of pores. For this reason, the gas flow path 54 can be manufactured in accordance with design, and the quality of the plug 50 is stable. A decrease in thickness of the linear flow paths 54*a*, 54*b*, and 54*c* enables arc discharge to be inhibited from occurring in the gas flow path 54. An increase in the number of the linear flow paths 54*a*, 54*b*, and 54*c* or the number of the opening portions 54*p* and 54*q* enables a sufficient gas flow rate to be ensured even when the linear flow paths 54*a*, 54*b*, and 54*c* are thin. In addition, the length of the gas flow path 54 can be sufficiently increased, and accordingly, the withstand voltage of the plug 50 increases.

The maximum length Hmax of the gas flow path 54 in the up-down direction is preferably 0.5 mm or less. This enables arc discharge to be sufficiently inhibited from occurring in the gas flow path 54. When the heat conduction gas is helium, it is thought that electrons that are generated by ionization of helium that is supplied to the plugs 50 from gas holes 34 are accelerated and collide with another helium while plasma is generated, and the arc discharge consequently occurs. When the maximum length Hmax of the gas flow path 54 in the up-down direction is 0.5 mm or less, the electrons are not sufficiently accelerated (in other words, a state in which energy lacks) but collide with the other helium, and this prevents arc discharge from occurring. In the case where arc discharge is to be more effectively prevented, the maximum length Hmax is preferably 0.3 mm or less.

The gas flow path 54 includes the multiple linear flow paths 54*a*, 54*b*, and 54*c* that linearly extend in the up-down direction, the left-right direction, and the front-rear direction and that are combined such that the multiple linear flow paths 54*a*, 54*b*, and 54*c* are perpendicular to each other. For this reason, the gas flow path 54 can be relatively easily designed.

The plug body 52 is composed of dense ceramics. The gas flow path 54 has no opening portions in the outer circumferential surface (the side surface) of the plug body 52. For this reason, when the outer circumferential surface of the plug body 52 and the inner circumferential surface of the plug installation hole 24 are stuck to each other by using an adhesive, the adhesive does not permeate the plug body 52. Accordingly, a gap can be prevented from being formed in the adhesive layer 26 that is used to stick the outer circumferential surface of the plug body 52 and the inner circumferential surface of the plug installation hole 24 to each other. Such a gap causes arcing and is not preferable. The plug body 52 is not a porous body and does not cause particles to drop.

The method of manufacturing each plug 50 includes the steps (a) to (d) described above. For this reason, the plug 50 that has the gas flow path 54 that includes the multiple linear flow paths 54*a*, 54*b*, and 54*c* that are combined such that the multiple linear flow paths 54*a*, 54*b*, and 54*c* intersect with each other in the plug body 52 can be easily manufactured with precision.

It is without saying that the present invention is not limited to the embodiment described above and can be carried out in various aspects within the technical scope of the present invention.

Figure 8A:
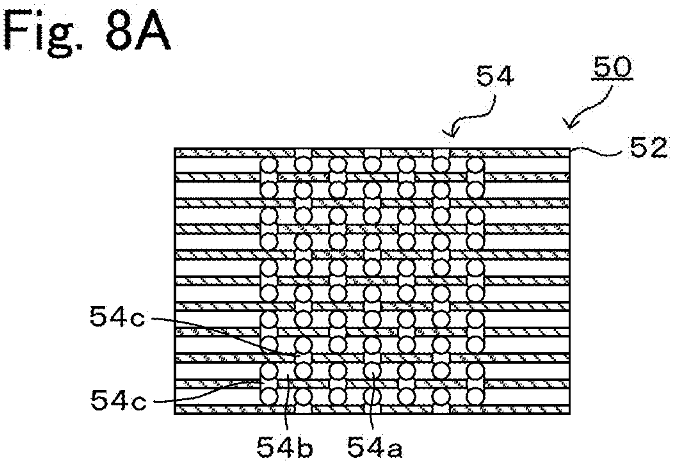
FIGS. 8A to 8C are sectional views of modifications to the plug 50.
Figure 8B:
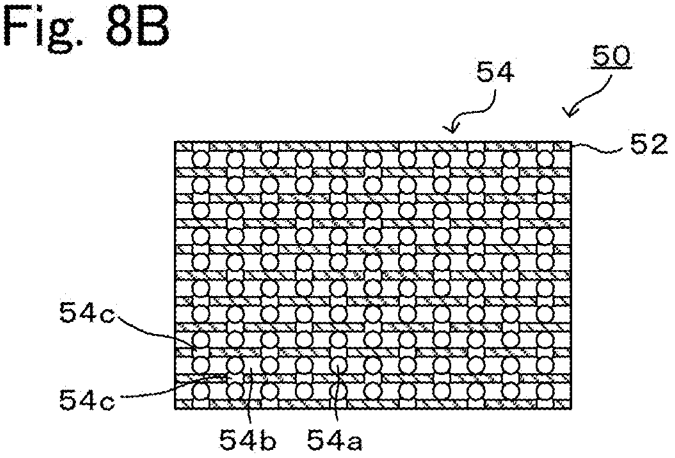
Figure 8C:
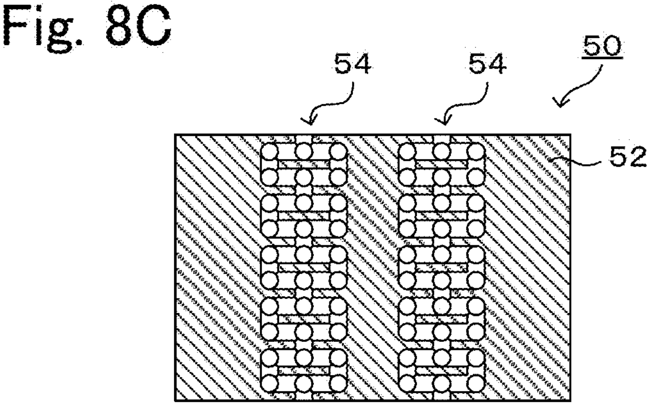

According to the embodiment described above, each plug 50 has the gas flow path 54 but is not particularly limited thereto. For example, as illustrated in FIGS. 8A to 8C, modifications to the plug 50 may be used. In FIGS. 8A to 8C, components like to those according to the embodiment described above are designated by using like reference signs. As for the plug 50 in FIG. 8A, linear flow paths 54*a* and 54*b* that are included in the gas flow path 54 extend in the horizontal direction and open on the outer circumferential surface (the side surface) of the plug body 52. Only one of the linear flow paths 54*a* and 54*b* may extend in the horizontal direction and may open on the outer circumferential surface of the plug body 52. As for the plug 50 illustrated in FIG. 8B, the gas flow path 54 is formed such that the linear flow paths 54*a*, 54*b* and 54*c* are provided in a lattice over the entire plug body 52. As for the plug 50 illustrated in FIG. 8C, the multiple gas flow paths 54 are provided in the plug body 52.

Figure 9:
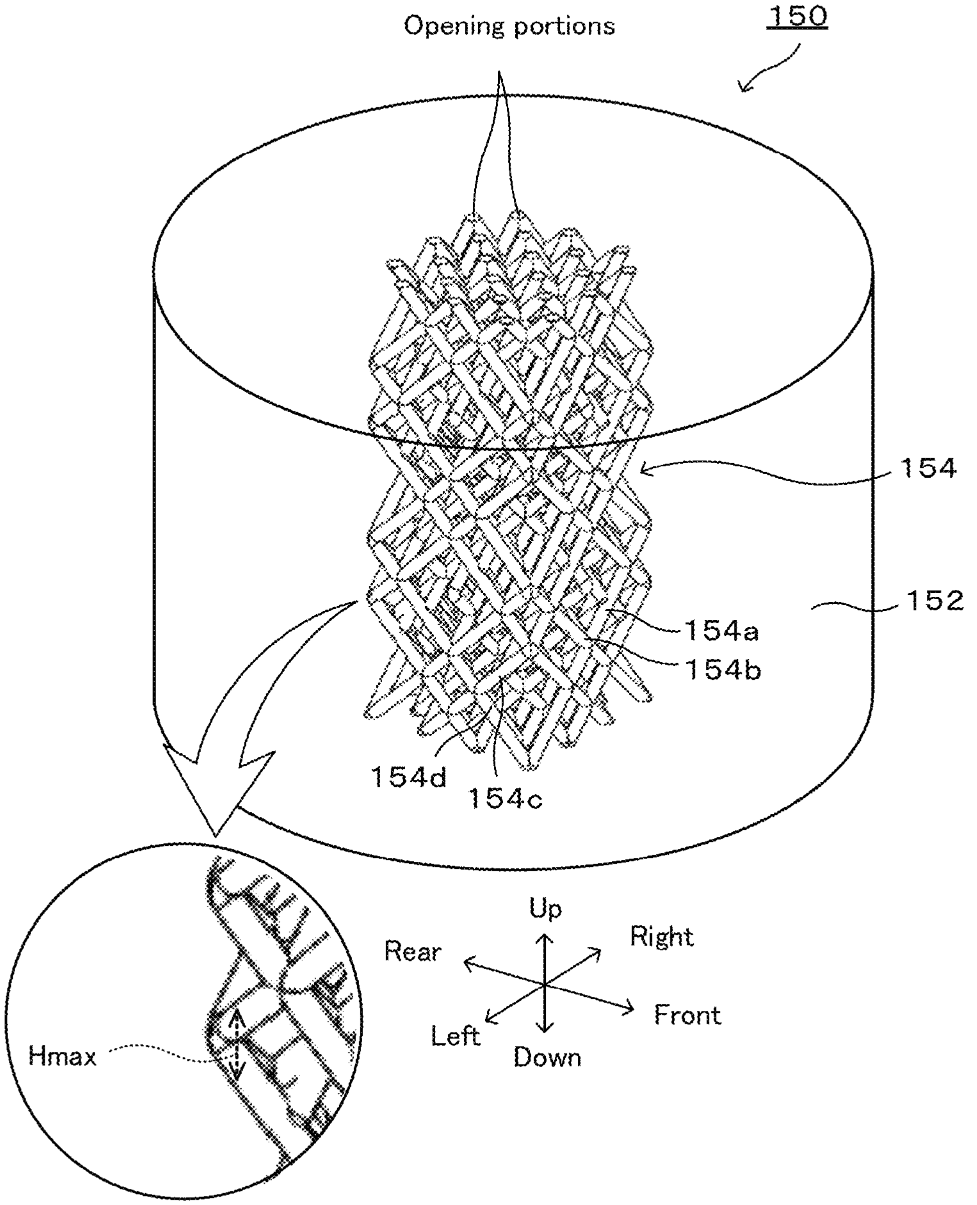
FIG. 9 is a reference perspective view of a plug 150.

A plug 150 illustrated in FIG. 9 may be used instead of the plug 50 according to the embodiment described above. FIG. 9 is a reference perspective view (a perspective view in which a gas flow path 154 that is to be originally represented by using a hidden line (a dashed line) is presented by using a solid line for convenience) of the plug 150. The plug 150 has the gas flow path 154 in a dense plug body 152. The gas flow path 154 includes multiple linear flow paths 154*a*, 154*b*, 154*c*, and 154*d* that linearly extend in oblique directions and that are combined such that the multiple linear flow paths 154*a*, 154*b*, 154*c*, and 154*d* intersect with each other and form a lattice and multiple opening portions in an upper surface and a lower surface of the plug body 152. The linear flow paths 154*a* incline in the left direction at a predetermined angle (for example, 45° or 60°) with respect to a horizontal plane. The linear flow paths 154*b* incline in the right direction at a predetermined angle with respect to the horizontal plane. The linear flow paths 154*c* incline in the front direction at a predetermined angle with respect to the horizontal plane. The linear flow paths 154*d* incline in the rear direction at a predetermined angle with respect to the horizontal plane. The gas flow path 154 can be relatively easily designed. The steps (a) to (d) described above enables manufacture to be relatively easy. The maximum length Hmax of the gas flow path 154 in the up-down direction corresponds to the height of a portion at which the linear flow paths 154*a* that extend in oblique directions intersect with each other as illustrated in an enlarged view of a portion in FIG. 9. The Hmax is preferably 0.5 mm or less, more preferably 0.3 mm or less. This enables arc discharge to be sufficiently inhibited from occurring in the gas flow path 154.

Figure 10:
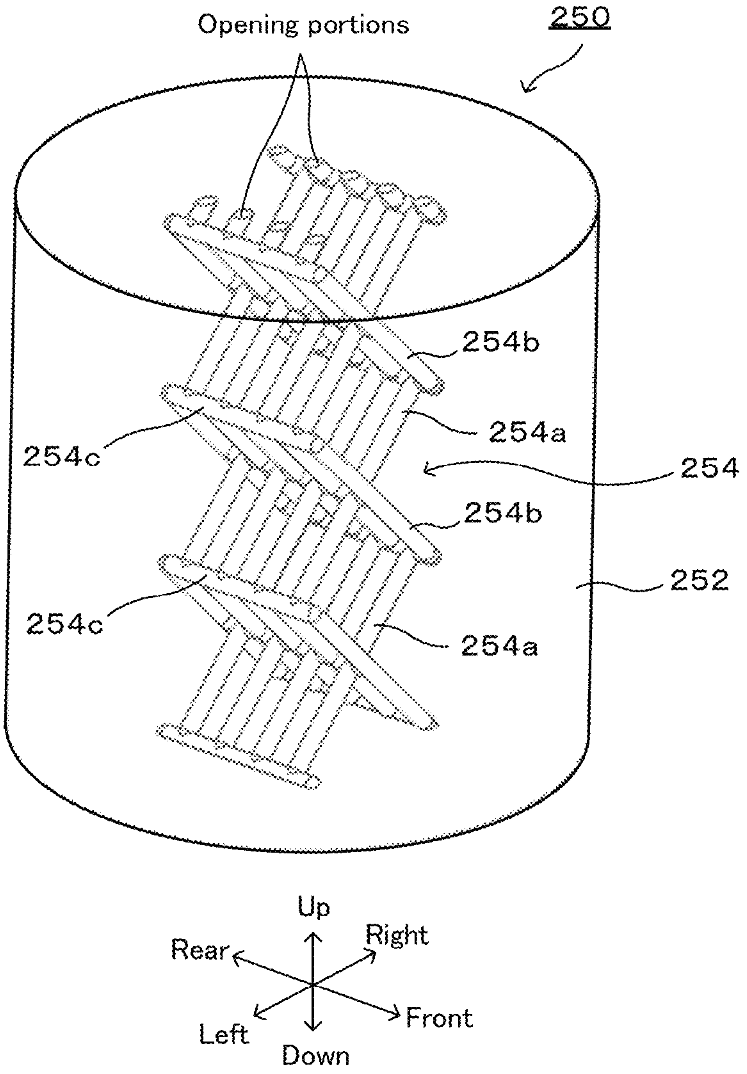
FIG. 10 is a reference perspective view of a plug 250.

A plug 250 illustrated in FIG. 10 may be used instead of the plug 50 according to the embodiment described above. FIG. 10 is a reference perspective view (a perspective view in which a gas flow path 254 that is to be originally represented by using a hidden line (a dashed line) is presented by using a solid line for convenience) of the plug 250. The plug 250 includes the gas flow path 254 in a dense plug body 252. The gas flow path 254 includes multiple linear flow paths 254*a* and 254*b* linearly extending in oblique directions and multiple linear flow paths 254*c* linearly extending in the horizontal direction that are combined in a lattice and multiple opening portions in an upper surface and a lower surface of the plug body 252. The linear flow paths 254*a* incline in the right direction at a predetermined angle with respect to a horizontal plane. The linear flow paths 254*b* incline in the left direction at a predetermined angle with respect to the horizontal plane. The linear flow path 254*a* and the linear flow path 254*b* are parallel with each other and are alternately spaced in the front-rear direction. The linear flow paths 254*c* are parallel with the front-rear direction and intersect with the linear flow paths 254*a* and 254*b* that alternately arranged. The gas flow path 254 can be relatively easily designed. The steps (a) to (d) described above enable manufacture to be relatively easy. The maximum length Hmax of the gas flow path 254 in the up-down direction is preferably 0.5 mm or less, more preferably 0.3 mm or less. This enables arc discharge to be sufficiently inhibited from occurring in the gas flow path 254.

According to the embodiment described above, the linear flow paths 54*a*, 54*b*, and 54*c* (that is, linear flow paths) that linearly extend in predetermined directions are described by way of example. However, this is not a limitation. For example, the linear flow paths 54*a*, 54*b*, and 54*c* may not be linear flow paths but may be curved flow paths.

According to the embodiment described above, the diameters of the linear flow paths 54*a*, 54*b*, and 54*c* are preferably 0.5 mm or less. In particular, the diameters of the linear flow paths 54*a*, 54*b*, and 54*c* are preferably determined to be 0.5 mm or less such that the maximum length Hmax of the gas flow path 54 in the up-down direction is 0.5 mm or less. The diameters and the maximum length Hmax are more preferably 0.3 mm or less.

According to the embodiment described above, the insulating pipe 60 is provided, but the insulating pipe 60 may be omitted. A gas channel structure may be provided instead of the gas holes 34 that are provided in the cooling plate 30. The gas channel structure may include a ring portion that is provided in the cooling plate 30 (above a cooling flow path 43) and that is concentric with the cooling plate 30 in a plan view, an introduction portion that introduces gas into the ring portion from a back surface of the cooling plate 30, and a distribution portion that distributes gas to the plugs 50 from the ring portion. The number of the introduction portion may be smaller than the number of the distribution portion and may be, for example, 1.

According to the embodiment described above, the electrostatic electrode is described as an example of the electrode 22 that is contained in the ceramic plate 20, but this is not a limitation. For example, the ceramic plate 20 may contain a heater electrode (a resistance heating element) instead of or in addition to the electrode 22 or may contain a RF electrode.

The present application claims priority from Japanese Patent Application No. 2022-203898, filed on Dec. 21, 2022, the entire contents of which are incorporated herein by reference.

What is claimed is:

1. A member for semiconductor manufacturing apparatus comprising:

a ceramic plate that has an upper surface that includes a wafer placement portion; and a plug that is installed in a plug installation hole extending through the ceramic plate in an up-down direction and that allows gas to pass therethrough, wherein the plug has a gas flow path that includes a plurality of linear flow paths that is combined such that the plurality of linear flow paths intersects with each other in a plug body, and wherein the gas flow path includes a plurality of opening portions in an upper surface and a lower surface of the plug body, and wherein a maximum length of the gas flow path in the up-down direction is 0.5 mm or less.

2. The member for semiconductor manufacturing apparatus according to claim 1, wherein the gas flow path includes the plurality of linear flow paths that linearly extends in the up-down direction, a left-right direction, and a front-rear direction and that is combined such that the plurality of linear flow paths is perpendicular to each other.

3. The member for semiconductor manufacturing apparatus according to claim 1, wherein the gas flow path includes the plurality of linear flow paths that linearly extends in an oblique direction and that is combined such that the plurality of linear flow paths intersects with each other or includes the plurality of linear flow paths that linearly extends in an oblique direction and in a horizontal direction and that is combined such that the plurality of linear flow paths intersects with each other.

4. The member for semiconductor manufacturing apparatus according to claim 1, wherein the plug body is composed of dense ceramics, and wherein the gas flow path includes no opening portion in a side surface of the plug body.

5. A plug in a ceramic plate comprising:

a plug body;

a gas flow path that includes a plurality of linear flow paths that is combined such that the plurality of linear flow paths intersects with each other in the plug body; and a plurality of opening portions that is included in the gas flow path and that opens from an upper surface and a lower surface of the plug body, and wherein a maximum length of the gas flow path in the up-down direction is 0.5 mm or less; and wherein the plug is installed in the ceramic plate.

* * * * *